(12) United States Patent
Rijpma et al.

(10) Patent No.: US 8,228,487 B2
(45) Date of Patent: Jul. 24, 2012

(54) LITHOGRAPHIC APPARATUS AND DEVICE MANUFACTURING METHOD

(75) Inventors: Albert Pieter Rijpma, Veldhoven (NL); Tjarko Adriaan Rudolf Van Empel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 618 days.

(21) Appl. No.: 12/389,077

(22) Filed: Feb. 19, 2009

(65) Prior Publication Data

US 2009/0207392 A1 Aug. 20, 2009

Related U.S. Application Data

(60) Provisional application No. 61/064,164, filed on Feb. 20, 2008.

(51) Int. Cl.
*G03B 27/58* (2006.01)
*G03B 27/62* (2006.01)

(52) U.S. Cl. ............................. 355/72; 355/75
(58) Field of Classification Search ............ 355/72, 355/75
See application file for complete search history.

(56) References Cited

U.S. PATENT DOCUMENTS

| | | | | |
|---|---|---|---|---|
| 4,720,732 A * | 1/1988 | Tsutsui | ............................ | 355/30 |
| 6,342,941 B1 | 1/2002 | Nei et al. | | |
| 6,645,701 B1 * | 11/2003 | Ota et al. | ....................... | 430/311 |
| 7,440,076 B2 * | 10/2008 | Kuit et al. | ......................... | 355/30 |
| 7,477,353 B2 | 1/2009 | Ito et al. | | |
| 7,804,583 B2 * | 9/2010 | Phillips et al. | ................... | 355/75 |
| 2006/0007420 A1 | 1/2006 | Ito et al. | | |
| 2007/0070324 A1 * | 3/2007 | Kuit et al. | ........................ | 355/72 |

FOREIGN PATENT DOCUMENTS

| | | |
|---|---|---|
| EP | 1770445 A1 | 4/2007 |
| JP | 05-234839 | 9/1993 |
| JP | 10-116772 | 5/1998 |
| JP | 10-242046 | 9/1998 |
| JP | 2003-229348 | 8/2003 |
| JP | 2006-024715 | 1/2006 |
| JP | 2007-096309 | 4/2007 |

OTHER PUBLICATIONS

Japanese Office Action for Japanese Patent Application No. 2009-030661, mailed on Jun. 3, 2011, including an English translation of the same.

* cited by examiner

*Primary Examiner* — Thomas R Artman
(74) *Attorney, Agent, or Firm* — Pillsbury Winthrop Shaw Pittman LLP (57) ABSTRACT

A lithographic apparatus is configured to transfer a pattern from a patterning structure, held by a patterning structure holder, onto a substrate that is held by a substrate holder. The apparatus includes a first object holder configured to hold an object, and an object temperature conditioner configured to condition a temperature of the object prior to and/or during transfer of the object to the first object holder. The object temperature conditioner includes a second object holder having a fluid duct system and an electrical temperature conditioner.

16 Claims, 5 Drawing Sheets

LITHOGRAPHIC APPARATUS AND DEVICE MANUFACTURING METHOD

CROSS-REFERENCE TO RELATED APPLICATIONS

This application claims that benefit of priority from U.S. Provisional Patent Application Ser. No. 61/064,164, filed Feb. 20, 2008, the entire content of which is incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more important factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

In known lithography apparatus, the substrate can be held by a substrate holder during the lithographic process. The average temperature of the substrate holder can vary during use. For example, during a certain period of time, the average temperature of the substrate holder can rise, for example by heating caused by incoming exposure radiation during exposure sequences and/or due to heating caused by nearby actuators or motors. This can lead to a temperature offset between the substrate and the substrate holder, which temperature offset may result in substrate distortion and/or overlay errors.

In known lithography apparatus, a patterning structure (reticle) can be held by a respective patterning structure holder during the lithographic process. Just after being transferred to the patterning structure holder, in the known apparatus and method, the patterning structure temperature rises (for example from room temperature to several degrees above room temperature), due to being irradiated by incoming exposure radiation. A resulting temperature offset between the patterning structure and the patterning structure holder, which temperature offset may result in distortion of the patterning structure, strain in the patterning structure, and overlay errors.

European Patent Application No. 1770445A1 proposes a lithographic apparatus arranged to transfer a pattern from a patterning structure onto a substrate, including a substrate holder configured to hold a substrate, and a substrate temperature conditioner configured to condition a temperature of the substrate prior to, during, or both, a transfer of the substrate to the substrate holder to substantially match a temperature of the substrate holder. In the known apparatus, the substrate temperature conditioning system may include a substrate support, located in a substrate handler, which support can be thermally controlled to bring the temperature of a substrate supported thereon to a desired temperature.

SUMMARY

It is desirable to improve the lithographic apparatus. Particularly, it is desired to provide an accurate uniform thermal conditioning of an object, for example a substrate or a patterning structure.

According to an embodiment, there is provided a lithographic apparatus, configured to transfer a pattern from a patterning structure, held by a patterning structure holder, onto a substrate that is held by a substrate holder. The apparatus comprises a first object holder configured to hold an object; and an object temperature conditioner configured to condition a temperature of the object prior to and/or during transfer of the object to the first object holder, wherein the object temperature conditioner comprises a second object holder having a fluid duct system and an electrical temperature conditioner.

According to an embodiment, there is provided a lithographic device manufacturing method, wherein a temperature of an object is being conditioned utilizing a second object holder prior to and/or during transfer of the object to a first object holder, wherein the second object holder has a fluid duct system and an electrical temperature conditioner. The method comprises: holding the object with the second object holder; and conditioning the temperature of the object, held by the second holder, by feeding a thermally conditioned fluid through the fluid duct system and by operating the electrical temperature conditioner.

According to an embodiment, there is provided a lithographic device manufacturing method comprising: holding an object with a first object holder, and conditioning the temperature of the object while the object is being held by the first object holder. The conditioning comprises feeding a thermally conditioned fluid through a fluid duct system of the first object holder, and operating an electrical temperature conditioner. The method also includes transferring the object to a second object holder; and projecting a patterned beam of radiation onto the object.

According to an embodiment, there is provided a lithographic device manufacturing method comprising: holding an object with a first object holder, and conditioning the temperature of the object while the object is being held by the first object holder. The conditioning comprises feeding a thermally conditioned fluid through a fluid duct system of the first object holder, and operating an electrical temperature conditioner. The method also includes transferring the object to a second object holder; patterning a beam of radiation with the object; and projecting the patterned beam of radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
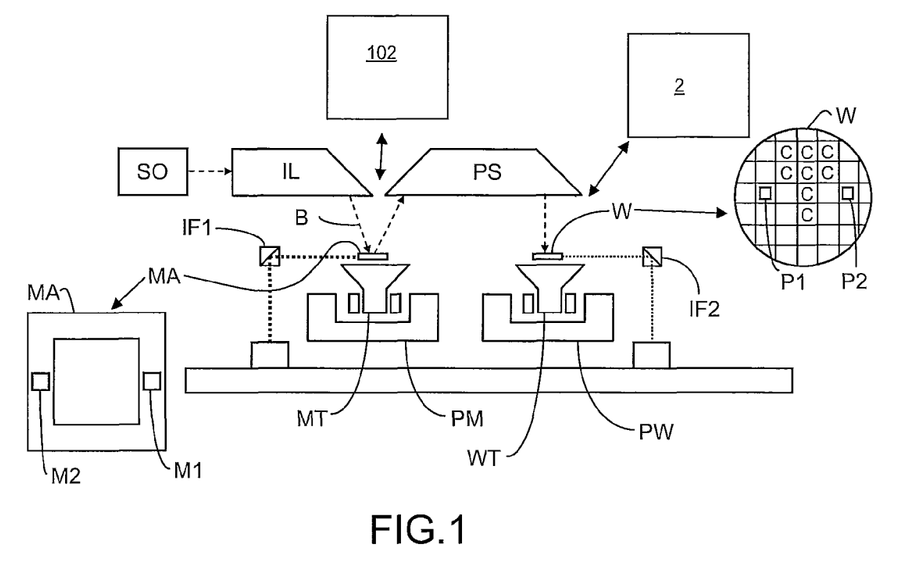
FIG. 1 depicts an embodiment of a lithographic apparatus.

FIG. 1 schematically depicts an example of a lithographic apparatus. The apparatus can comprise: an illumination system (illuminator) IL configured to condition a radiation beam B (e.g. EUV radiation); a first patterning holder MT (e.g. a mask table) constructed to hold (particularly to support) a patterning structure or device (e.g. a mask or a reticle) MA and preferably being connected to a first positioner PM configured to accurately position the patterning structure; a first substrate holder WT (e.g. a substrate table or wafer table) constructed to hold a substrate (e.g. a resist-coated wafer) W and preferably being connected to a second positioner PW configured to accurately position the substrate; and a projection system (e.g. a reflective projection lens system) PS configured to project a pattern imparted to the radiation beam B by patterning structure MA, held by the first patterning structure holder MT, onto a target portion C (e.g. comprising one or more dies) of a substrate W that is held by the first substrate holder WT.

Also, the apparatus can comprise a substrate handler 2 which is configured to handle substrates, for example to temporarily store one or more substrates before the substrate is transferred to the first substrate holder. The substrate handler 2 can also be arranged, for example, for pre-alignment. For example, the first substrate holder WT or part of the first substrate holder WT can be movable toward and from the substrate handler 2 for the substrate exchange. The substrate handler 2 can be a separate or modular component with respect to other parts of the apparatus. For example, the substrate handler 2 can be provided with or communicate with one or more load-locks (not shown). Also, the apparatus can be provided with one or more such substrate handlers.

The apparatus may include a patterning structure handler 102 that may be configured to handle patterning structures, for example to temporarily store one or more patterning structures MA before they are transferred to the first patterning structure holder MT. A patterning structure handler 102 can be a separate or modular component with respect to other parts of the apparatus. For example, the patterning structure handler 102 can be provided with or communicate with one or more load-locks (not shown). Also, the apparatus can be provided with one or more such patterning structure handlers 102.

Embodiments of parts of the substrate hander 2 and patterning structure handler 102 are described below.

The illumination system can include various types of optical components, such as refractive, reflective, magnetic, electromagnetic, electrostatic or other types of optical components, or any combination thereof, for directing, shaping, or controlling radiation.

The first patterning structure holder MT can hold the patterning structure in a manner that depends on the orientation of the patterning structure, the design of the lithographic apparatus, and other conditions, such as for example whether or not the patterning structure is held in a vacuum environment. The support structure can use mechanical, vacuum, electrostatic or other clamping techniques to hold the patterning structure. The support structure can be a frame or a table, for example, which can be fixed or movable as required. The support structure can ensure that the patterning structure is at a desired position, for example with respect to the projection system.

The term "patterning structure" should be broadly interpreted as referring to any device that can be used to impart a radiation beam with a pattern in its cross-section such as to create a pattern in a target portion of the substrate. The pattern imparted to the radiation beam can correspond to a particular functional layer in a device being created in the target portion, such as an integrated circuit.

The patterning structure can be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" can encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It can be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, during operation, the illuminator IL can receive a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning structure (e.g., mask) MA, which is held on the respective first holder or support structure (e.g., mask table) MT, and is patterned by the patterning structure. After being reflected from the patterning structure (e.g. mask) MA, the radiation beam B passes through the projection system PS, which focuses the beam onto a target portion C of the substrate W (held by the respective holder WT). With the aid of the second positioner PW and position sensor IF2 (e.g. an interferometric device, linear encoder or capacitive sensor), the first substrate holder WT (e.g. substrate table) can be moved accurately, e.g. so as to position different target portions C in the path of the radiation beam B. Similarly, the first positioner PM and another position sensor IF1 can be used to accurately position the patterning structure (e.g. mask) MA with respect to the path of the radiation beam B. Patterning structure (e.g. mask) MA and substrate W may be aligned using mask alignment marks M1, M2 and substrate alignment marks P1, P2.

The depicted apparatus could be used in at least one of the following modes:

1. In step mode, the reticle holding structure (e.g. mask table) MT and the first substrate holder WT are kept essentially stationary, while an entire pattern imparted to the radiation beam is projected onto a target portion C at one time (i.e. a single static exposure). The substrate holder WT is then shifted in the X and/or Y direction so that a different target portion C can be exposed.

2. In scan mode, the mask holder structure (e.g. mask table) MT and the first substrate holder WT are scanned synchronously while a pattern imparted to the radiation beam is projected onto a target portion C (i.e. a single dynamic exposure). The velocity and direction of the substrate holder WT relative to the mask holder (e.g. mask table) MT may be determined by the (de-)magnification and image reversal characteristics of the projection system PS.

3. In another mode, the mask holder (e.g. mask table) MT is kept essentially stationary holding a programmable patterning structure, and the substrate holder WT is moved or scanned while a pattern imparted to the radiation beam is projected onto a target portion C. In this mode, generally a pulsed radiation source is employed and the programmable patterning structure is updated as required after each movement of the substrate holder WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 2:
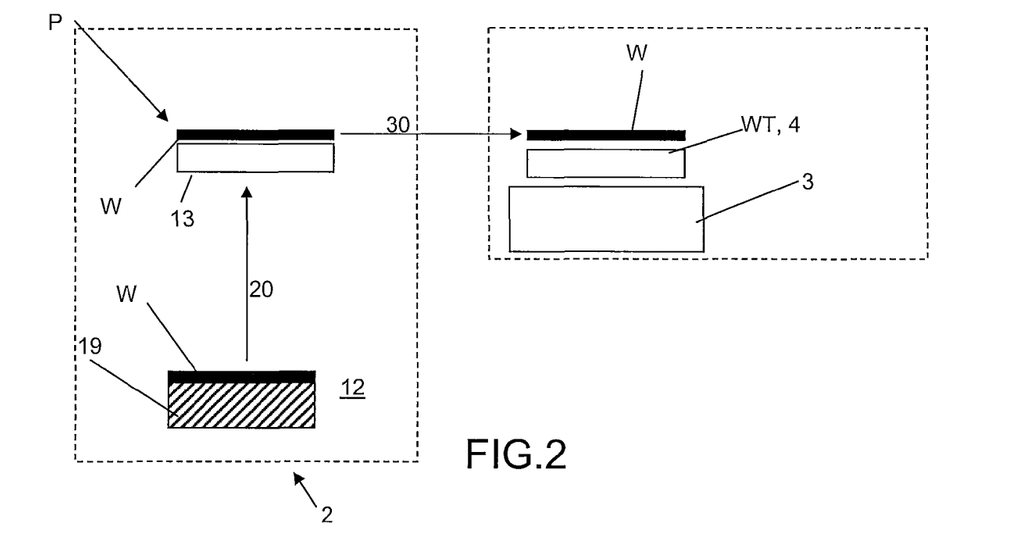
FIG. 2 depicts an embodiment of part of the apparatus of FIG. 1.

FIG. 2 depicts an embodiment of part of a lithographic apparatus. In FIG. 2, only part of the apparatus is depicted. The embodiment of FIG. 2 can include all or a number of the above-mentioned features of a lithographic apparatus and/or of the embodiment shown in FIG. 1. The lithographic apparatus can also be constructed differently.

The apparatus shown in FIG. 2 is provided with a substrate handler 2 and a substrate stage 3. The substrate stage 3 includes a first substrate holder, the substrate holder comprising, for example, a chuck 4 which holds a substrate table WT. The substrate holder 4, WT can also be configured differently. In FIG. 2, the chuck 4 and substrate table WT are schematically shown as being one part (the substrate holder), however, generally, they may be separate parts. As is shown in FIG. 2, a substrate W can be held by the substrate table WT, for example a substrate W which is to be illuminated by a projection beam, such that a pattern from a patterning structure can be transferred to the substrate during use. Such a projection beam and patterning structure are not shown in FIG. 2, but they can be configured, for example, as described above regarding FIG. 1, as will be clear to the person skilled in the art.

The substrate stage and/or substrate holder may be configured in various ways. For example, a support side of the substrate table WT, which support side faces the substrate W during use, may comprise support protrusions or burls. Such protrusions can contact a surface of the substrate W mechanically during use. Additionally or alternatively, the substrate table WT and/or chuck 4 might include a cooling system, such as a cooling water system and/or water cooled heat shield which is configured to supply cooling water to and/or through the substrate table WT and/or chuck 4. For example, the substrate table WT may include narrow channels, which can be fed by cooling water during use to cool the substrate table WT. Also or alternatively, for example, the chuck 4 may include a water cooled heat shield. Such a cooling water system is not depicted in the Figures.

The substrate stage may be provided with various positioners to position the substrate with respect to a projection system (such a system is not shown in FIG. 2, but an example of a projection system is visible in FIG. 1).

The substrate handler 2 may also be configured in various ways. For example, the substrate handler 2 may be configured to hold or store one or more substrates during a desired period of time.

The substrate handler 2 may be configured to receive one or more substrates from an environment of the apparatus, to temporarily store the one or more substrates, and to transfer the one or more substrates to and/or from the substrate table WT.

The substrate handler 2 may include, or be coupled to, one or more load locks (not shown), for example when the lithographic apparatus 1 includes one or more vacuum compartments. The substrate handler 2 may be configured to operate at or near atmospheric pressure, at vacuum pressures and/or at different pressures. The substrate handler 2 may include one or more aligners (not shown) to align a substrate, for example onto the substrate holder 4, WT. Also, the substrate handler 2 may include one or more substrate loading positions to load one or more substrates W which are to be transferred to the substrate stage 3. One loading position P is depicted in FIG. 2.

The substrate handler 2 comprises a second substrate holder 13 (e.g. a substrate support) to hold a substrate in the loading position P. The second holder 13 may be configured in various ways. For example, the substrate holder 13 can comprise a fixed support table, a robot gripper, or be configured differently. Embodiments of a second holder are depicted in FIGS. 4-8, and described below.

Also, the substrate handler 2 may include one or more substrate unloading positions to remove one or more substrates W from a substrate holder 4, WT. Additionally, the substrate handler 2 may include one or more substrate 'buffer' positions to temporarily store substrates W before being transferred to the substrate stage 3, and/or after having been illuminated by the respective lithographic apparatus.

The apparatus can include a mechanism (schematically depicted by arrow 30) which is arranged or configured to transfer one or more substrates W from part of the substrate handler 2 to the substrate holder 4, WT and/or vice versa. The substrate handler 2 and substrate stage 3 may be arranged or configured in various ways to transfer substrates therebetween. For example, one or more passageways (not specifically depicted) can be provided between the substrate handler 2 and substrate stage 3, to convey substrates and/or substrate holders (particularly substrate tables WT) therebetween. Also, one or more robot arms, conveyors, transport means or other transfer mechanisms can be provided to move a substrate W and/or substrate holder WT from the substrate handler 2 to the substrate stage 3 and/or vice-versa. For example, the substrate handler 2 and/or the substrate stage 3 may include one or more suitable substrate transporters.

In an embodiment, at least part of the first substrate holder 4, WT may be movable between a position closer to the substrate handler to receive a substrate therefrom, after which the substrate holder 4, WT may be moved to a position suitable to illuminate the substrate with a projection beam. In that case, a robot or robot gripper (not shown) may be provided to transport the substrate between the substrate handler and the substrate table WT. For example, the apparatus may be provided with a separate substrate handler compartment and a separate substrate stage compartment. For example, the substrate stage compartment may contain one or more exposure substrate holders 4, WT. The robot may be part of the substrate handler and/or part of the substrate stage compartment, or may be provided in a separate robot unit between a substrate handler 2 and a substrate stage 3 or substrate stage compartment.

For example, the substrate stage 3 or part of the substrate stage 3 may be movable from and to an interior 12 of the substrate handler 2. For example, the chuck 4 and/or substrate table WT may be moveable from a loading position P of the substrate handler 2 to a processing position at the substrate stage 3.

Further, the substrate handler 2 may include a thermal treatment system 19 configured to preprocess one or more substrates W. Optionally, the substrate handler 2 can include one or more thermal plates 19, for example a water cooled cooling plate 19, to swiftly cool one or more substrates W to a preprocessing temperature, for example a temperature that is lower than an instantaneous temperature of the first substrate holder WT (see below). One such cooling plate 19 has been depicted in FIG. 2. The cooling plate 19 is located away from the substrate loading position P. A mechanism to transport the substrate(s) from the cooling plate 19 to the substrate loading position P is not depicted, however, it will be clear to the skilled person how such a mechanism can be constructed. Such a transport is schematically depicted in FIG. 2 using an arrow 20.

The apparatus of the embodiment of FIG. 2 is provided with a substrate temperature conditioning system, also called a substrate temperature conditioner or thermal stabilization unit herein. The temperature conditioning system can be configured to actively condition the temperature of a substrate W before the substrate W is transferred to the substrate holder 4, WT, for example, such that the substrate temperature substantially matches an instantaneous, real time, temperature of the substrate holder 4, WT. The substrate temperature conditioning system may also be configured to actively condition the temperature of the substrate W during transfer of the substrate W to the substrate holder 4, WT.

The substrate temperature conditioning system can be configured in various ways, and may depend, for example, on the pressure in the substrate handler.

As an example, the substrate temperature conditioning system can be provided with a sensor (not shown) which is configured to measure the temperature of at least part of the substrate holder 4, WT, for example, the chuck 4 and/or the substrate table WT, for example, to determine an instantaneous and/or average temperature of a substrate supporting part WT of the first substrate holder.

At least part of the substrate temperature conditioning system may be included in the substrate handler 2. One or more parts of the substrate temperature conditioning system may be located elsewhere in the system, for example, in a suitable location in or around the substrate stage 3.

The substrate temperature conditioning system may further include one or more heating and/or cooling apparatus to heat and/or cool the substrate before the substrate is transferred to the substrate holder, and/or during such transfer. In an embodiment, the heating and/or cooling apparatus is installed near the loading position P of the substrate W, in the substrate handler 2, to thermally condition a substrate W that is located in the loading position P. Such heating and/or cooling apparatus may be constructed in various ways.

For example, the substrate temperature conditioning system may be configured to heat and/or cool a substrate, being held in the substrate handler 2 (by the second holder 13), using heat radiation, heat conductance and/or heat convection. Heat radiation and/or conduction may be useful, for example, when the pressure in the substrate handler is a relatively low pressure, or should be kept relatively low. A heat transfer fluid (for example a gas film) can be applied to enhance heat transfer between substrate W and second holder 13.

As an example, the substrate temperature conditioning system may include the afore-mentioned second substrate holder 13 of the substrate handler 2, wherein the holder 13 can be thermally controlled to bring the temperature of a substrate W supported thereon to the desired temperature. Particularly, the holder 13 is controlled to obtain a predetermined temperature, and holds the substrate W such that the substrate is thermally conditioned to obtain that temperature as well. For example, heat can flow between the substrate W (held by the holder 13) and the holder 13 substantially (for example for more than 90%) via heat conduction, with no or almost no heat transfer (between substrate holder 13 and substrate W) via radiation and convection.

According to an embodiment, a heat transfer fluid (particularly a gas or gas mixture) may be applied between the second holder 13 and a substrate W, held by the holder, during operation. For example, the heat transfer gas can be supplied from one or more gas supply openings (not shown) of the holder 13, or by different means, to a space htg (see FIG. 3) that can be enclosed by opposite surfaces of the second holder 13 and substrate W during operation. The application of such a heat transfer gas as such is known; for example, the heat transfer gas can be Helium or Hydrogen, or a different gas. The heat transfer gas can provide at least part of heat flow between holder 13 and substrate (when the substrate is being held by the holder), as will be appreciated by the skilled person.

Figure 3:
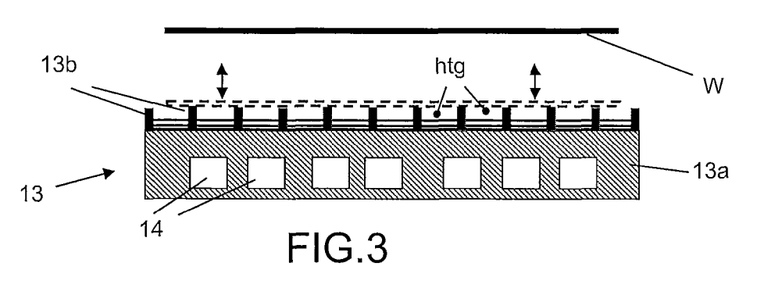
FIG. 3 schematically depicts a cross-section of an embodiment of an object holder.

FIG. 3 shows an example of a second substrate holder 13 that comprises one or more fluid ducts 14 for conducting a temperature conditioning fluid (for example water, having a predetermined temperature) through a thermally well conducting mass 13a of the holder 13. The apparatus can be provided with a fluid supplier (not shown) configured to feed the fluid to the fluid duct system 14 of the second object support, as will be appreciated by the skilled person. According to an embodiment, a flow rate of fluid (for example water, of a different fluid) flowing through the holder 13 can be more than about 1 liter/minute, for example, at least about 5 liter/minute, or a different flow rate.

For example, the temperature of the fluid that is supplied to the duct system 14 during operation can be in the range of about 0-100° C., for example, a range of about 10-30° C., for example, about room temperature (22° C.), or a different temperature or temperature range. The temperature of the fluid can be kept substantially constant during operation, or that temperature can be actively controlled depending on a desired substrate temperature that is to be achieved. Preferably, the temperature of the fluid is actively controlled, to remain at a predetermined constant temperature (for example 22.00° C.+/−0.05° C.).

For example, the second substrate holder 13 can be configured to clamp the substrate there-to, particularly such that at least parts of the substrate W are held in good thermal conductive contact with (a substrate supporting surface of) the holder 13. For example, the second substrate holder 13 can be configured to use mechanical, vacuum, electrostatic or other clamping techniques to hold the substrate W.

The second holder 13 may define a substrate supporting surface (preferably made of a material having good heat transfer properties, i.e., having a high heat transfer coefficient) that supports the substrate W during operation. In the present examples, the second holder 13 is provided with a support side, which support side faces the substrate W during use, wherein the support side comprises (i.e., is defined by) outer surfaces or top parts of support protrusions/burls 13b. Such protrusions 13b can contact a surface of the substrate W mechanically during use. A clamped position of a substrate W is indicated by dashed lines in FIG. 3. Also, for example, an aforementioned heat transfer fluid (particularly a gas or gas mixture) can be fed to the space htg (see FIG. 3) that is enclosed between substrate W and holder 13, the space htg extending around/between the lateral sides of the protrusions (burls) 13b, such that heat can be transferred between the substrate W and holder 13 at least via/by that heat transfer fluid. The heat transfer fluid can be used in respect of any of second holder embodiments configured to use mechanical, vacuum, or electrostatic holding techniques, and other holder 13 configurations, as will be appreciated by the skilled person.

For example, during operation, the second holder 13 can accept a substrate W at "any" temperature, and thermally condition it (particularly by holding the substrate W during a certain thermal conditioning period), for example to an instantaneous temperature of the first substrate holder WT.

It is desirable to provide a high level of thermal control (in the range of mK) at high substrate throughput (i.e. the number of substrates that is processed by the apparatus per hour). Also, it is desirable to provide a homogeneous, uniform thermal conditioning of the substrate W prior to and/or during substrate transfer from the second substrate support to the first support WT, to minimize overlay errors during a subsequent lithographic process. Particularly, a substrate temperature uniformity (measured over the entire substrate area, viewed in top view of the substrate) better than about 10 mK is desired. It has been found that the example of the second substrate support 13 shown in FIG. 3 is relatively sensitive to pressure variations of fluid flowing through the fluid channels 14. Particularly, it has been found that a 1 bar pressure drop in the ducts 14 can result in about 25 mK heating of a substrate held by the holder 13, due to fluid friction in the ducts 13. A solution to this problem may be to reduce volume flow rate of the fluid, however, that would reduce the thermal conditioning efficiency of the fluid. Thermal conditioning efficiency of the fluid can be increased by minimizing the distance between the ducts 14 and the substrate supporting surface, however, that would lead to a thermal imprint of the ducts 14 on the substrate W (i.e., thermal non-uniformity of the substrate W).

Figure 4:
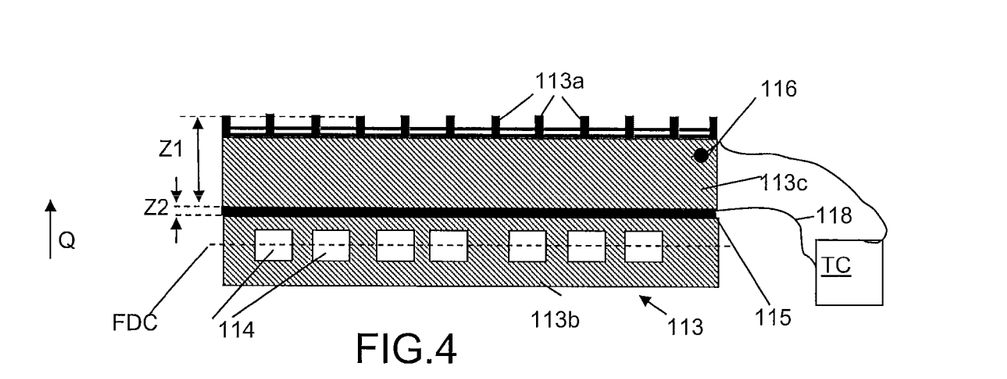
FIG. 4 schematically depicts an embodiment of an object holder.

FIG. 4 shows an embodiment of a second object holder 113 that can provide very good, stable, swift and uniform thermal conditioning of a substrate W being held thereby. Particularly, the embodiment of FIG. 4 can be relatively insensitive to thermal instabilities or temperature changes due to the operation of the fluid duct system. The embodiment of FIG. 4 differs from the example shown in FIG. 3 in that it comprises a fluid duct system 114 as well as an electrical temperature conditioner 115. The electrical temperature conditioner 115 can provide additional thermal conditioning of the second holder 113 (in addition to temperature conditioning provided via the fluid duct system 114), for example to compensate for fluid duct system 114 related thermal fluctuations or deviations.

According to an embodiment, the electrical temperature conditioner comprises an electrical heater 115 that is configured to generate heat from electrical energy. In an embodiment, for example, the electrical temperature conditioner 115 can comprise a Peltier element, so that the electrical temperature conditioner can transfer heat to the second holder 113 (for heating the holder) or from the substrate holder 114 (to cool the holder). Also, for example, the electrical temperature conditioner 115 can be selected from the group consisting of a electrical resistor, an electrically conducting film, and a wire heater. The skilled person will appreciate that the electrical temperature conditioner 115 of the second substrate holder 113 can include one or more heaters, one or more Peltier elements, one or more resistors, one or more electrically conducting films, and/or one or more wire-type heaters.

According to an embodiment (see FIG. 4), the electrical temperature conditioner 115 extends substantially in parallel with the substrate supporting surface that is defined by the holder 113. As in the present embodiments, the electrical temperature conditioner 115 can extend substantially in parallel with a virtual central plane FDC of the fluid duct system 114 (said virtual central plane FDC being parallel to the substrate supporting surface, as well). The electrical temperature conditioner 115 may be electrically isolated from the fluid duct system 114, for example by having electrical isolation itself, and/or by the material or composition of the holder part 113b that contains the duct system 114.

According to an embodiment (see FIG. 4), the electrical temperature conditioner 115 can be substantially uninterrupted, when viewed in cross-section, however, this is not an essential feature. The electrical temperature conditioner 115 can be a one-piece electrical device, or it can comprise different sections (see for example FIG. 6B).

Preferably, the electrical temperature conditioner 115 is dimensioned and arranged to define a respective 2-dimensional electrical thermal conditioning field (i.e. area), which field extends at least between the substrate supporting side/surface and the fluid duct system 114 of the holder 113, and desirably at a fixed distance Z1 from that surface (measured in a direction Q that is normal with respect to that surface). For example, said fixed distance Z1 can be relatively large, for example about 1 cm or more. For example, the electrical thermal conditioning field can include one or more substantially 2-dimensional, thin electrical conditioning devices that can provide respective uniform thermal conditioning.

According to an embodiment, a maximum thickness Z2 of the electrical temperature conditioner 115 (measured is measured in the direction Q that is normal with respect to the substrate holding surface) may be about 1 cm or less, for example about 0.5 cm, or for example about 1 mm or smaller, for example about 0.1 mm. The electrical temperature conditioner 115 may have a constant thickness Z2. The electrical temperature conditioner 115 may be configured to provide thermal conditioning (for example heat generation or hear removal) at or near each point of said thermal conditioning field.

In the embodiment of FIG. 4, the electrical temperature conditioner 115 (or its respective field) is integrated in the substrate holder 113. The electrical temperature conditioner 115 substantially separates the substrate holder 113 into an upper part 113c that includes the substrate support side (and protrusions 113a), and a lower part 113b that includes the fluid duct system 114. The upper part 113c may be a massive, uninterrupted part, made of a suitable material to provide heat transfer between the protrusions 113a on one hand and the electrical temperature conditioner 115 and lower part 113b on the other hand. Preferably, the electrical temperature conditioner 115 as such is configured to allow heat transfer between the lower and upper parts 113b, 113c.

For example, each of the lower and upper part 113b, 113c can be made of a material or substance, having a relatively high thermal conductivity. For example the substrate holder parts 113b, 113c can be made of a metal, an alloy, Silicon carbide, Silicon-silicon carbide, aluminium, stainless steel, aluminium nitride, or one or more different materials or compositions.

According to an embodiment, the electrical temperature conditioner 115 can be electrically powered using alternating current (AC), or direct current (DC). For example, a temperature control system TC (schematically shown) that includes a suitable power source can be connected to the electrical temperature conditioner 115, for example via suitable wiring 118, to power the electrical temperature conditioner 115.

The electrical temperature conditioner 115 can be a low power device. For example, the temperature conditioning system can be configured to power the electrical temperature conditioner 115 with a voltage in the range of about 0-50 V, or for example about 0-24 V. A temperature conditioning current to power the electrical temperature conditioner 115 may, for example, be in the range of about 0-10 A, or in a range of about 0-2 A.

In case the electrical temperature conditioner 115 is a heater, it can be for example a low power heater having a maximum heat generating capacity of about 100 Watt, or for example about 50 Watt, or for example a maximum of about 20 Watt. The efficiency of the heater may be near 100%, or 100%, that is, the heater can convert about all electrical energy fed to the heater, into heat).

According to an embodiment (see FIG. 4), the substrate holder 113 includes a film heater 115. The film heater 115 can be electrically powered to uniformly generate heat in the second substrate holder 113. Particularly, the film heater can be a uniform, homogeneous film or layer of heater material, for example a material having a predefined electrical heater resistance. Film heaters as such are commercially available. The film heater can for example consist of a layer structure, for example a structure comprising a thin electrically conducting layer interposed between electrically isolating layers, for example a conducting layer composed of a metal or alloy, the conducting layer for example being chrome or aluminium, and isolating layer consisting of glass or different electrically isolating material. As a further example, the electrically conducting layer of a film heater can have a thickness of less than 10 microns, for example a thickness of about 1 micron (or less).

According to a non-limiting example, the substrate temperature conditioning system may also include an optional sensor 116 configured to measure the temperature of at least part of the second substrate holder 113, particularly a part that is located near (for example just below) the substrate support side. The sensor 116 can be integrated with the holder 113. The sensor 116 can be arranged in various ways, for example as one or more thermocouples, heat sensitive materials, integrated temperature measurement devices, thermistors, platinum temperature sensors, or in any other way. In an embodiment, the sensor 116 can include a temperature dependent electrical resistance. The sensor may include, as an example, one or more thermocouples, pyrometers, integrated temperature measurement devices, thermistors (particularly a positive temperature coefficient (PTC) thermistor), one or more thermally sensitive materials, for example a material which contracts or expands due to temperature variations, or a combination of such or other types of thermal detectors. Besides, the second holder 113 can be integrally provided with a plurality of temperature sensors 116. The temperature a temperature control system (controller TC) can receive temperature measurement data from the sensor 116 (for example via respective wiring), to be used in controlling the thermal conditioning.

For example, the controller TC can be configured, to compare the temperature of the second substrate holder 113 with a temperature of the first substrate holder 4, WT (which temperature can be measured by via respective sensor means, not shown as such). As an example, the controller TC may be arranged to control (i.e. power) the electrical thermal conditioning film 115 such, that the temperature of the second holder 113 maintains a predetermined temperature, for example an instantaneous temperature of the first substrate holder 4, WT. To this aim, for example, the controller TC may include a comparator, an electronic control, a computer controller, suitable computer software and/or a different type of control. The controller TC may be arranged to bring a substrate W, held by the second support 113, to a certain desired temperature in a desired amount of time. To this end, the controller TC may, for example, make use of data obtained from trial and error calibration runs and/or from standard theoretical considerations and/or calculations, as will be clear to the skilled person.

During operation, the temperature of the substrate W may be manipulated inside the substrate handler 2 to match the temperature of, for example, the chuck 4 and/or the substrate table WT, before the substrate is loaded to the substrate stage.

During operation, for example as part of a lithographic device manufacturing method, a substrate W can be held (for example clamped) by the second holder 113, to be thermally conditioned thereby (prior to and/or during transfer of the object to the first object holder). The thermal conditioning at least includes feeding a thermally conditioned fluid (for example water) through the fluid duct system 114 and simultaneously operating the film-type heater 115. The heater 115 can be powered continuously, or only during specific operating periods, depending for example on temperature conditioning parameters such as heat loads, substrate and substrate holder temperatures and other parameters, as will be appreciated by the skilled person. Activation and deactivation of the heater 115 can be carried out automatically by the controller TC. The thermal conditioning may involve maintaining the second holder 113 at substantially the same instantaneous temperature as a temperature of the first substrate holder 4, WT.

According to an embodiment, during operation, the substrate W has an initial temperature that is lower than a temperature of the first object holder 4, WT (and particularly also of the second object holder 113) before the object is being conditioned by the second holder 113. In that case, the temperature conditioning comprises heating the substrate W, via the second holder 113, when the substrate is being supported on the second holder. For example, heat can be transferred from the second holder via its protrusions 113a to the substrate W.

The controller TC may activate and deactivate the film heater 115 depending on the actual temperature of the second holder 113 (the temperature being detected by the respective sensor 116). Alternatively or additionally, one or more detectors (not shown) may be used which directly or indirectly measure the temperature of the substrate W, wherein the result of that measurement can be used by the controller 6 to control the powering of the film heater 115.

Also, the controller TC can actively adjust the amount of electrical power (real-time, instantaneous) that is fed to the heater 115 to compensate for certain (for example temporary) temperature drops of the holder 113 (for example temperature drops relating to heat transfer to a substrate that is being held by the holder 113). Thus, according to a further embodiment, the control/powering of the film heater 115 (as provided by control system TC) can be instantaneously dependent of the actual detected temperature of the second holder 113, and/or of detected variation (rise or fall) of that temperature.

The thermal conditioning system may be configured such that a detected rising temperature of the holder 113 may lead automatically to reduction of heating current that is fed to the film heater 115 and, vice-versa, a detected falling temperature of the holder 113 leads automatically to increase of heating current that is fed to the film heater 115. Also, for example, the thermal conditioning system can be configured such that a certain detected rising temperature (for example a respective temperature gradient) of the holder 113 leads automatically deactivation of the heater 115 and, vice-versa, a certain detected falling temperature (for example a respective temperature gradient) of the holder 113 leads automatically to an activation of the heater 115.

The thermal conditioning system can be configured to predict or estimate future changes of the temperature of the second holder 113, and to control the operation of the heater 115 (for example to activate or deactivate the heater, or to adjust a respective heater current) in order to avoid or reduce any predicted or estimated future temperature change (of that holder 113).

In this way, the fluid duct system 114 can provide a primary thermal conditioning of the second substrate holder 113, wherein the electrical thermal conditioner 115 can respond swiftly to temperature variations (and compensate those changes) of the holder 113 and/or the substrate W held by the holder 113.

A potential advantage of the system shown in FIG. 4 is that independent of fluid-flow and a certain bulk mass of the second holder 113, the film heater 114 can uniformly compensate for the heat loads from the substrate W. Moreover, the response of the thermal conditioning system, can be relatively fast.

Figure 5:
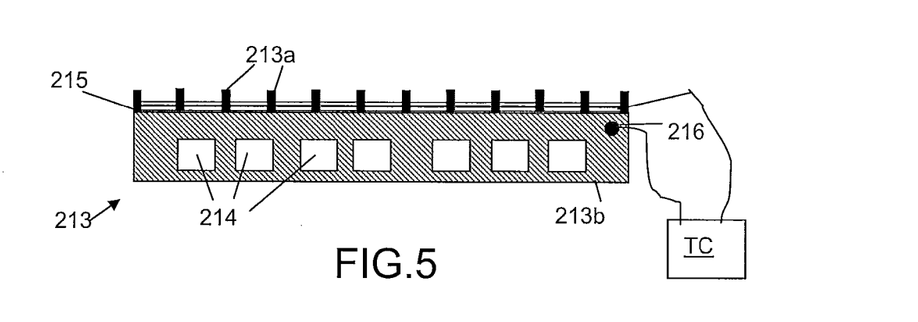
FIG. 5 schematically depicts an embodiment of an object holder.

FIG. 5 shows an embodiment of a second holder 213 which differs from the embodiment of FIG. 4 in that the electrical temperature conditioner 215 is located near the substrate support surface. For example, the electrical temperature conditioner 215 (which may, again, be a film heater, for example) can extend in, on or just below an upper surface of a main part 213b (containing the fluid duct system 214) of the holder 213. The protrusions 213a protrude from the upper surface of the main part 213b towards the substrate support surface. In this way, a compact holder can be provided, wherein the electrical temperature conditioner 215 can respond promptly to any thermal variations.

Figure 6A:
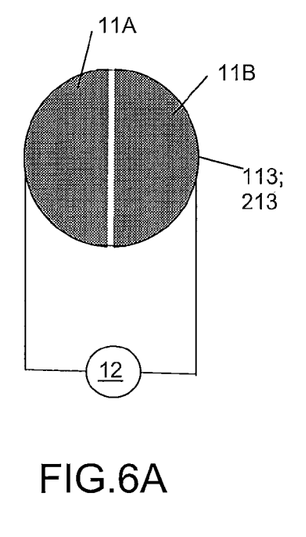
FIG. 6A schematically depicts a top view of an embodiment of an object holder.

According to an embodiment, the second substrate holder may comprise an electrode system that is configured to hold an object by electrostatic force. This applies for each of the above-described configurations/embodiments. FIG. 6A schematically depicts a further embodiment of the second holder 113, 213 in top view without showing the protrusions, comprising a bipolar electrostatic clamp system (known as such to the skilled person). The bipolar clamp system can comprise two electrodes 11A, 11B (being electrically isolated from each other to prevent short circuit there-between) and a voltage source 112 to apply a relatively high electrical potential difference to the electrodes 11A, 11B. For example, the potential difference can be in the range of about 0.2-3 kV, or a different range.

Figure 6B:
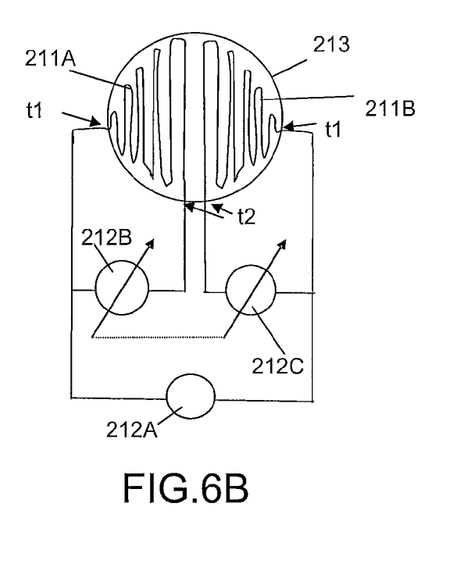
FIG. 6B schematically depicts an embodiment of an object holder.

According to an embodiment, the electrical temperature conditioner may be part of the electrode system (of the electrostatic clamp). An example of this embodiment is depicted in FIG. 6B, which shows a variant of the FIG. 6A configuration. FIG. 6B can be a top view of the embodiment depicted in FIG. 5 (without showing the protrusions 213a), wherein the holder 213 is provided with two electrodes 211A, 211B and a first voltage source 212A to apply a relatively high electrical potential difference to the electrodes 211A, 211B. For example, as above, the potential difference can be in the range of about 0.2-3 kV, or a different range. In this embodiment, each electrode 211A, 211B as such may also operate as a heating element (of the temperature conditioning system). To this aim, second voltage sources 212B, 212C (which can be part of an above-mentioned controller TC) is/are coupled to the electrodes 211A, 211B to induce heating currents therein. For example, first terminals of the second voltage sources 212B, 212C can be electrically connected to first electrode terminals t1 that are electrically connected to terminals of the first source 212A. Second terminals of the second voltage sources 212B, 212C can be electrically connected to second electrode terminals t2. Each pair of first and second electrode terminals is arranged to allow flow of heating current through the respective electrode when potential difference is applied to those terminals (as in FIG. 6B). The second voltage sources 212B, 212C can be controlled (by controller TC) to provide the same heating voltage to respective electrodes 211A, 211B, particularly in case the electrodes 211A, 211B as such have the same electrical configuration (as in the present embodiment).

During operation, the electrodes 211A, 211B can each be powered by the second sources 212B, 212C with a voltage in the range of about 0-250 V, or for example about 0-20 V. A temperature conditioning current to power the electrodes 211A, 211B may, for example, be in the range of about 0-10 A, or in a range of about 0-2 A.

During operation of the device of FIG. 6B, the electric temperature conditioner, provided by the two electrodes 211A, 211B, can conduct two separate electrical heater currents, and can simultaneously generates a bipolar electrostatic clamping field to electrostatically clamp a substrate to the support 213.

The clamping electrode 211A, 211B that also provides heating capability can be configured in many ways, as will be appreciated by the skilled person. For example, the clamp can be shaped or be provided with a resistive heater wire, preferably being laid in a relatively dense pattern to provide a suitable electrostatic clamping field (as in FIG. 6B). In an embodiment, for example, each electrode can be a film heater.

The configuration of FIG. 6B also provides a relatively compact system, wherein electrostatic clamp functionality and thermal conditioning system functionality are integrated with one another in an elegant manner.

Figure 7:
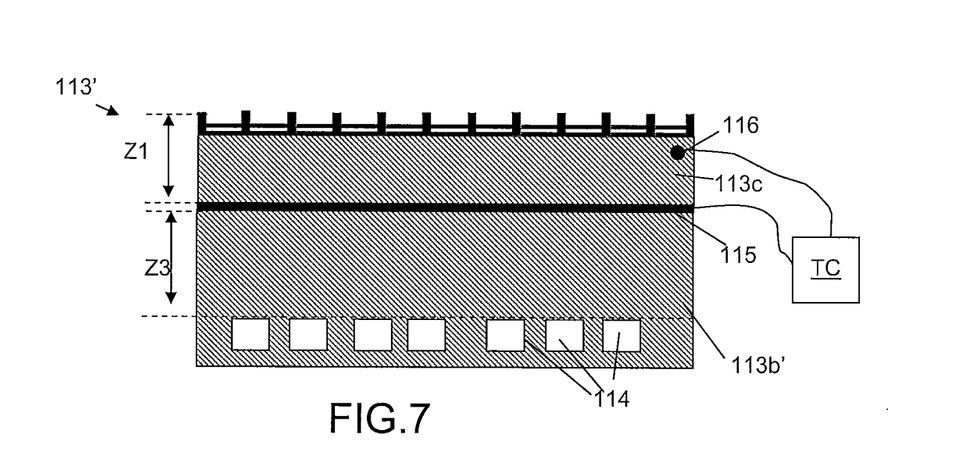
FIG. 7 schematically depicts an embodiment of an object holder.

FIG. 7 depicts an embodiment of a second substrate holder 113', which differs from the FIGS. 4-6 embodiments in that the electric temperature conditioner 115 is located relatively far away from the fluid duct system, by a distance Z3 (measured in a direction normal with respect to the substrate supporting side of the holder 113'). Particularly, in this way, a relatively large mass (of the second holder part 113b') between fluid (in the ducts 114) and electric temperature conditioner 115 is provided. As in the above embodiments, the electric temperature conditioner 115 can be actively controlled by the controller TC and a respective sensor 116. For example, the separation Z3 between electrical temperature conditioner 115 and ducts 114 can be larger than the distance Z1 between electrical temperature conditioner 115 the substrate supporting side/surface of the holder 113'. In this way, thermal gradients due to duct channel layout can be reduced at the substrate support level of the system.

Figure 8:
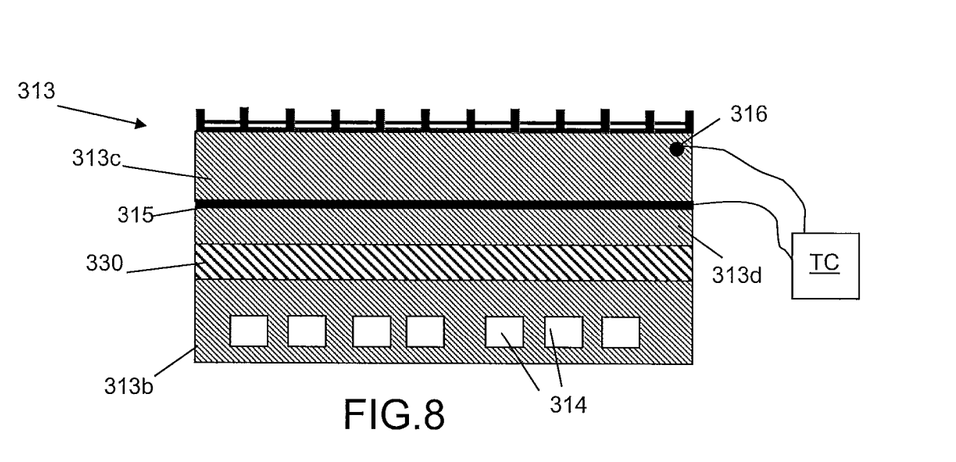
FIG. 8 schematically depicts an embodiment of an object holder.

FIG. 8 depicts an embodiment of a second substrate holder 313, which differs from any of the FIGS. 4-7 embodiments in that the second holder 313 comprises a thermal buffer (i.e. barrier) 330. The thermal buffer 330 extends between the electrical temperature conditioner 315 and the fluid duct system 314. Particularly, the thermal buffer 330 thermally separates the holder 313 into an upper part 313c, 313d comprising the electrical temperature conditioner 315, and a lower part 313b comprising the fluid duct system 314.

The thermal buffer part 330 is spaced-apart from the electrical temperature conditioner 315, by a holder heat transfer part 313d. The thermal buffer part 330 is spaced-apart from the fluid duct system, by part a holder heat transfer part 313b. The thermal buffer part 330 may be made of a thermal buffer material or composition that has a lower heat transfer coefficient than a heat transfer coefficient of (the materiel or composition of) each of the heat transfer parts 313b, 313 d. The thermal buffer part 330 may be made of a plastic, a glassy material, silicon-oxide, of a different material. The thermal buffer part material (composition) can be different heat transfer part material (composition).

According to an embodiment, the thermal buffer 330 can have a maximum thermal conductivity of about 20 W/K, or about 10 W/K, in a direction normal with respect to the substrate support surface of the holder.

The embodiment of FIG. 8 can provide relatively little or substantially no imprint of the duct channel configuration onto substrate temperature conditioning. Also, during operation, a relatively permanent heat flow can be achieved from the electrical temperature conditioner 315 to fluid flowing through the duct system, for example to respond quickly to substrates W arriving at the holder 313 "too warm" as well as "too cold".

In the abovementioned embodiments, a system has been described to thermally condition substrates W. According to an alternative embodiment, the same principles can be applied in conditioning patterning structures MA, via a patterning structure handler 102. In that case, for example, the object is a patterning structure and the first object holder is the patterning structure holder MT. A lithographic apparatus can be provided with one or both of the temperature conditioning system to thermally conditioning substrates W, and the temperature conditioning system for thermally conditioning patterning devices MA.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be understood that in the present application, the terms "comprising" and "including" do not exclude other elements or steps. Also, each of the terms "a" and "an" does not exclude a plurality. Any reference sign(s) in the claims shall not be construed as limiting the scope of the claims.

What is claimed is:

1. A lithographic apparatus, configured to transfer a pattern from a patterning structure, held by a patterning structure holder, onto a substrate that is held by a substrate holder, the apparatus comprising:
a first object holder configured to hold an object; and
an object temperature conditioner configured to condition a temperature of the object prior to and/or during transfer of the object to the first object holder, the object temperature conditioner comprising a second object holder having a fluid duct system and an electrical temperature conditioner, wherein the second object holder comprises an electrode system that is configured to hold the object by electrostatic force, and wherein the electrical temperature conditioner is part of the electrode system.

2. The apparatus according to claim 1, wherein the electrical temperature conditioner comprises an electrical heater that is configured to generate heat from electrical energy.

3. The apparatus according to claim 1, wherein the apparatus is configured to apply a heat transfer fluid between the second object holder and an object held by the second object holder.

4. The apparatus according to claim 1, wherein the electrical temperature conditioner is selected from the group consisting of: a resistor, an electrically conducting film, and a wire heater.

5. The apparatus according to claim 1, wherein the object is the substrate and the first object holder is the substrate holder.

6. The apparatus according to claim 1, wherein the object is the patterning structure and the first object holder is the patterning structure holder.

7. The apparatus according to claim 1, wherein the electrical temperature conditioner is configured to provide thermal conditioning at or near each point of a 2-dimensional thermal conditioning field.

8. The apparatus according to claim 1, wherein the second object holder defines an object supporting surface that supports the object during operation, wherein the electrical temperature conditioner extends in parallel with the object supporting surface.

9. The apparatus according to claim 1, wherein the second object holder contains at least one of the following materials: a metal, an alloy, steel, aluminium, silicon, silicon carbide, silicon-silicon carbide, aluminium, stainless steel, and aluminium nitride.

10. The apparatus according to claim 1, wherein the second object holder comprises a heat transfer part that extends between the electrical temperature conditioner and an object support side of the second object holder, and a thermal buffer part that extends between the electrical temperature conditioner and the fluid duct system.

11. The apparatus according to claim 10, wherein the heat transfer part is made of a material that differs from material of the thermal buffer part.

12. A lithographic device manufacturing method, wherein a temperature of an object is being conditioned utilizing a second object holder prior to and/or during transfer of the object to a first object holder, wherein the second object holder has a fluid duct system and an electrical temperature conditioner, the method comprising:
holding the object with the second object holder; and
conditioning the temperature of the object, held by the second holder, by feeding a thermally conditioned fluid through the fluid duct system and by operating the electrical temperature conditioner, wherein the electric temperature conditioner conducts one or more electrical heater currents, and generates an electrostatic clamping field to electrostatically clamp the object to the second object holder.

13. The method according to claim 12, wherein the object has an initial temperature that is lower than a temperature of the first object holder, before the object is being conditioned by the second object holder.

14. The method according to claim 12, wherein the temperature conditioning comprises heating the object.

15. A lithographic device manufacturing method comprising:
holding an object with a first object holder;
conditioning the temperature of the object while the object is being held by the first object holder, said conditioning comprising
feeding a thermally conditioned fluid through a fluid duct system of the first object holder, and
operating an electrical temperature conditioner of the first object holder, wherein the electric temperature conditioner conducts one or more electrical heater currents, and generates an electrostatic clamping field to electrostatically clamp the object to the first object holder;
transferring the object to a second object holder; and
projecting a patterned beam of radiation onto the object.

16. A lithographic device manufacturing method comprising:
holding an object with a first object holder;
conditioning the temperature of the object while the object is being held by the first object holder, said conditioning comprising
feeding a thermally conditioned fluid through a fluid duct system of the first object holder, and
operating an electrical temperature conditioner of the first object holder, wherein the electric temperature conditioner conducts one or more electrical heater currents, and generates an electrostatic clamping field to electrostatically clamp the object to the first object holder;
transferring the object to a second object holder;
patterning a beam of radiation with the object; and
projecting the patterned beam of radiation onto a substrate.

* * * * *